United States Patent
Ruelke et al.

(10) Patent No.: US 7,030,044 B2
(45) Date of Patent: Apr. 18, 2006

(54) METHOD OF FORMING A CAP LAYER HAVING ANTI-REFLECTIVE CHARACTERISTICS ON TOP OF A LOW-K DIELECTRIC

(75) Inventors: Hartmut Ruelke, Dresden (DE); Joerg Hohage, Dresden (DE); Thomas Werner, Dresden (DE); Frank Mauersberger, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 46 days.

(21) Appl. No.: 10/463,910

(22) Filed: Jun. 16, 2003

(65) Prior Publication Data

US 2004/0121621 A1  Jun. 24, 2004

(30) Foreign Application Priority Data

Dec. 23, 2002  (DE) ........................................ 102 60 619

(51) Int. Cl.
   *H01L 21/31*  (2006.01)
   *H01L 21/469*  (2006.01)

(52) U.S. Cl. ....................... 438/786; 438/700; 438/736; 438/952

(58) Field of Classification Search ................ 438/786, 438/700, 702, 717, 725, 723, 736, 744, 950, 438/952
   See application file for complete search history.

(56) References Cited

U.S. PATENT DOCUMENTS

| | | | |
|---|---|---|---|
| 6,100,559 A * | 8/2000 | Keetai | 257/315 |
| 6,156,640 A | 12/2000 | Tsai et al. | 438/636 |
| 6,235,653 B1 * | 5/2001 | Chien et al. | 438/788 |
| 6,255,717 B1 | 7/2001 | Babcock et al. | 257/640 |
| 6,294,457 B1 | 9/2001 | Liu | 438/623 |
| 6,423,654 B1 * | 7/2002 | Sim et al. | 438/791 |
| 6,475,925 B1 | 11/2002 | Braeckelmann et al. | 438/763 |
| 6,664,177 B1 * | 12/2003 | Lin et al. | 438/624 |
| 6,664,201 B1 * | 12/2003 | Gau et al. | 438/786 |
| 2001/0008226 A1 | 7/2001 | Hung et al. | 216/18 |
| 2001/0027083 A1 | 10/2001 | Farkas et al. | 451/41 |
| 2002/0009829 A1 | 1/2002 | Yin et al. | 438/113 |
| 2002/0022358 A1 | 2/2002 | Yin et al. | 438/636 |
| 2002/0024139 A1 | 2/2002 | Chan et al. | 257/758 |
| 2002/0039836 A1 | 4/2002 | Venkatesan et al. | 438/622 |
| 2003/0132510 A1 * | 7/2003 | Barth et al. | 257/637 |

FOREIGN PATENT DOCUMENTS

EP  0 975 010 A1  1/2000

OTHER PUBLICATIONS

International Search Report for PCT/US 03/35272.*

* cited by examiner

*Primary Examiner*—Caridad M. Everhart
(74) *Attorney, Agent, or Firm*—Williams, Morgan & Amerson, P.C.

(57) ABSTRACT

A method of forming a multi-layer stack over a low-k dielectric layer is disclosed, wherein the multi-layer stack provides an improved anti-reflective effect and an enhanced protection of the underlying low-k dielectric material during the chemical mechanical polishing process. The multi-layer stack includes silicon dioxide based sub-layers, which may be formed in a highly efficient, non-expensive plasma enhanced deposition method, wherein the optical characteristics may be adjusted by varying a ratio of silane and nitrogen oxide during the deposition.

11 Claims, 4 Drawing Sheets

METHOD OF FORMING A CAP LAYER HAVING ANTI-REFLECTIVE CHARACTERISTICS ON TOP OF A LOW-K DIELECTRIC

BACKGROUND OF THE INVENTION

1. Field of the Invention

Generally, the present invention relates to the formation of integrated circuits, and, more particularly, to the formation of metallization layers including a metal embedded into a dielectric material having a low permittivity to enhance device performance.

2. Description of the Related Art

In modern integrated circuits, minimum features sizes, such as the channel length of field effect transistors, have reached the deep sub-micron range, thereby steadily increasing performance of these circuits in terms of speed and power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 0.35 µm, a limiting factor of device performance is the signal propagation delay caused by the switching speed of the transistor elements. As the channel length of these transistor elements has now reached 0.18 µm and less, it turns out, however, that the signal propagation delay is no longer determined by the field effect transistors, but is limited, owing to the increased package density of the circuits, by the close proximity of the interconnect lines, since the line-to-line capacitance is increased in combination with a reduced conductivity of the lines due to their reduced cross-sectional area. The parasitic RC time constants increased by the increased line-to-line capacitance and the higher line resistances may not easily be compensated for without the introduction of a new type of material for forming metallization layers.

Traditionally, metallization layers are formed by a dielectric layer stack including, for example, silicon dioxide and/or silicon nitride with aluminum as the typical metal. Since aluminum exhibits significant electromigration at higher current densities, it is being replaced by copper, which has a significantly lower electrical resistance, a higher thermal conductivity and a higher resistivity against electromigration. Although device characteristics may significantly improve by applying copper as the metallization metal, for devices having feature sizes of 0.13 µm and less, it turns out that, additionally, the well-established and well-known dielectric materials, silicon dioxide ($k \approx 4.2$) and silicon nitride ($k > 5$), have to be replaced by so-called low-k dielectric materials in order to effectively reduce signal propagation delay by interconnect lines. The transition from the well-known and well-established aluminum/silicon dioxide metallization layer to a low-k dielectric/copper metallization layer, however, is associated with a plurality of issues that must be dealt with.

For example, copper may not be deposited in higher amounts in an efficient manner by well-established deposition methods, such as chemical vapor deposition. Additionally, copper may not be efficiently patterned by anisotropic etch processes and therefore the so-called damascene technique is employed in forming metallization layers including copper. Typically, in the damascene technique, the dielectric layer is deposited and then patterned with trenches and vias that are subsequently filled with copper by plating methods, such as electroplating or electroless plating. In order to reliably fill the trenches and vias, a certain amount of "overfill" is required and necessitates the subsequent removal of the excess copper. For removing the excess copper and thereby additionally planarizing the surface of the metallization layer, chemical mechanical polishing (CMP) has proven to be a viable process technique, although the removal of one or more materials from a substrate surface at sufficiently high removal rates without unduly affecting underlying material layers is a quite complex task.

The situation becomes even more complicated when a low-k dielectric material is provided instead of the well-known silicon dioxide, since typically the properties of the low-k dielectric material significantly differ from those of the silicon dioxide, especially where the mechanical stability is concerned. Since copper readily diffuses in a plurality of dielectric materials, usually one or more barrier layers are provided prior to the deposition of the copper and these barrier layers have to be removed along with the copper to provide electrically insulated interconnect lines and vias. Typical barrier materials, such as tantalum and tantalum nitride, exhibit a significantly higher hardness than the copper so that, at least at a last step of the CMP process, respective process parameters are selected to obtain a sufficiently high removal rate, thereby, however, jeopardizing the underlying soft low-k dielectric material. Since a certain degree of overpolish is required to reliably insulate the individual trenches and lines from each other, a significant polish of the low-k dielectric layer and also of the copper may occur, especially when the removal rate varies across the substrate surface. The final trenches and vias may then exhibit an undesired resistance variation due to fluctuations in their cross-sectional areas, thereby requiring that the process margins be set correspondingly wider.

A further issue of patterning the low-k dielectric layer concerns the photolithography technique, as especially the damascene technique requires the formation of precisely registered trenches and vias over a low-k dielectric material, possibly including highly reflective copper regions. Consequently, an anti-reflective coating (ARC) is usually formed over the low-k dielectric material to minimize the back-reflection of light into a photoresist layer formed on the ARC layer.

With reference to FIGS. 1a-1c, a typical conventional process technique for patterning a low-k dielectric material will now be described. In FIG. 1a, a semiconductor structure 100 comprises a substrate 101 including a first dielectric layer 102 in which a plurality of narrow metal regions 103 and a wide metal region 104 are formed. The substrate 101 may include a plurality of circuit elements (not shown), some or all of which may be electrically connected to one or more of the metal regions 103 and 104. The metal region may be comprised of any appropriate material, such as aluminum, copper, tantalum, titanium, tungsten, and the like. The first dielectric layer 102 may be comprised of any appropriate insulating material and, in sophisticated integrated circuits, the first dielectric layer 102 may be comprised of a low-k dielectric material. An etch stop layer 105 is formed over the first dielectric layer 102 and the metal regions 103, 104, followed by a second dielectric layer 106 substantially comprised of a low-k dielectric material in which highly conductive interconnect lines and vias are to be formed. Appropriate low-k materials may include hydrogen-containing silicon oxycarbide (SiCOH), or other silicon-containing materials, such as SiLK. Other appropriate low-K materials are MSQ, HSQ and the like. An anti-reflective coating layer 107 is located above the second dielectric layer 106 and a resist mask 108 is formed on the anti-reflective coating layer 107. The resist mask 108 comprises openings 109 and 110, the dimensions of which substantially correspond to the dimensions of the lines and vias to be formed in the second dielectric layer 106.

A typical process for forming the semiconductor structure 100 as shown in FIG. 1a may comprise the following processes. After providing the substrate 101 with the first dielectric layer 102 and the metal regions 103, 104 formed therein, wherein the formation of the first dielectric layer 102 and the metal regions 103, 104 may include substantially the same process steps as will be described later on, the etch stop layer 105 is formed by, for example, chemical vapor deposition. Typically, the etch stop layer 105 is formed of a low-k material so as to not unduly compromise the overall characteristics of the finally obtained insulating layer. Appropriate materials are silicon carbide and nitrogen-doped silicon carbide. For less critical applications, the etch stop layer 105 may be comprised of silicon nitride and other dielectric materials having a relatively high k. Thereafter, the second dielectric layer 106 is formed by advanced deposition methods or by spin-on techniques, depending on the type of low-k material used. Irrespective of the method for forming the second dielectric layer 106, in general the mechanical properties significantly differ from those of a conventional dielectric material such as silicon dioxide. After the formation of the low-k dielectric layer 106, the anti-reflective coating layer 107 is formed, wherein the optical characteristics thereof are adjusted so as to minimize the back reflection for a given wave-length during a subsequent photolithography step. For example, the anti-reflective coating layer 107 may be comprised of silicon-rich oxynitride, the optical characteristics of which may be adjusted by controlling the amount of silicon incorporated into the layer 107 during the deposition, by providing a specified ratio of the precursor gases during the deposition of the layer 107 to achieve a specified refractive index and extinction coefficient. Additionally the thickness of the layer 107 is controlled to finally match the optical characteristics to the underlying material layers and to the photoresist used for forming the resist mask 108. A proper adaptation of the anti-reflective coating layer 107 is especially important during the formation of trenches and vias over the highly reflective metal regions 103, 104. Next, a layer of photoresist is formed on the anti-reflective coating layer 107, wherein a thickness and a composition of the photoresist is selected in conformity with the wavelength used for exposing the photoresist and the underlying anti-reflective coating layer 107. After exposure, the photoresist is then developed to form the resist mask 108 including the openings 109 and 110.

FIG. 1b schematically shows the semiconductor structure 100 in an advanced manufacturing stage. Openings 113 and 114 are formed in the etch stop layer 105, the second dielectric layer 106, and the anti-reflective coating layer 107 over the metal regions 103 and 104, respectively. A barrier layer 111, for example comprising tantalum and/or tantalum nitride, is formed on the anti-reflective coating layer 107 and within the openings 113 and 114. Furthermore, copper 112 is filled in the openings 113 and 114, wherein excess copper is also provided outside the openings 113 and 114.

Starting from the configuration of FIG. 1a, an anisotropic etch process is carried out to form the openings 113, 114 in the anti-reflective coating layer 107, the low-k dielectric layer 106, and the etch stop layer 105. Due to the very different characteristics of these layers, varying etch parameters may be selected to finally obtain the openings 113, 114. In particular, the etch stop layer 105 exhibits a significantly lower etch rate than the low-k dielectric layer 106 to reliably stop the etch process on and in the etch stop layer 105, which is then opened by a different etch process. After performing one or more cleaning steps, for example to clean the exposed metal surface of the regions 103, 104, the barrier layer 111 is deposited by advanced sputter deposition techniques, wherein, depending on the type of material of the layer 106 and the metal to be filled in the opening 113, 114, an appropriate composition of the barrier layer 111 is selected. In a silicon-based layer 106 with copper as the fill metal, a bi-layer of tantalum/tantalum nitride is frequently used as the barrier layer 111. Thereafter, when copper is used as metal, a copper seed layer (not shown) is sputter deposited on the barrier layer 111 and then the bulk copper is deposited by electrochemical techniques.

FIG. 1c schematically depicts the semiconductor structure 100 with a completed metallization layer 120 including the low-k dielectric layer 106 and the copper-filled trenches 113, 114. As previously noted, the excess copper of the layer 112, shown in FIG. 1b, is removed by CMP, wherein typically a multi-step process is performed to effectively remove the excess copper and planarize the surface of the structure 100. During the removal of the excess copper, the barrier layer 111 outside the trenches 113 and 114 is also removed in order to electrically insulate neighboring trenches from each other. Moreover, the anti-reflective coating layer 107, typically exhibiting a relatively high k value, is removed so as to not unduly compromise the low-k characteristics of the metallization layer 120. In removing the barrier layer 111 and the anti-reflective coating layer 107, a certain amount of the dielectric material of the layer 106 and of the copper in the trenches 113, 114 may also be removed, wherein the degree of overpolishing depends on the type of structure, its position on the substrate surface since the removal rate may vary across the substrate diameter, and the like. In FIG. 1c, the removal rate at the relatively closely spaced trenches 113 may be higher than at the substrate location in the vicinity of the isolated trench 114. Due to the reduced mechanical stability of the low-k dielectric layer 106, a significant variation of the layer thickness may occur due to erosion, as indicated by 121, which finally results in a corresponding variation of the line resistance of the trenches 113. As previously noted, incompletely removing the anti-reflective coating layer 107 is not a promising option since the relatively high k value may result in substantial variations in the parasitic RC time constants in regions with minimally removed anti-reflective coating layer 107.

It has therefore been proposed to provide a specific cap layer prior to the formation of the anti-reflective coating layer 107 that may protect the underlying low-k dielectric layer during the CMP process. The corresponding formation of an additional cap layer and an anti-reflective coating layer, however, adds additional complexity and cost.

In view of the above-identified problems, a need therefore exists for an improved technique in patterning a low-k dielectric material layer.

SUMMARY OF THE INVENTION

The present invention is generally directed to a method of forming a cap layer that sufficiently protects the low-k dielectric layer during chemical mechanical polishing, and additionally allows the adjustment of the optical characteristics thereof within a single deposition chamber without unduly adding complexity to the deposition process.

According to one illustrative embodiment of the present invention, a method comprises the formation of a multi-layer stack over a dielectric layer comprised of a low-k dielectric material by forming a layer of silicon dioxide over the low-k dielectric layer. Furthermore, a silicon-rich oxynitride layer is formed during the formation of the layer of silicon dioxide to thereby adjust at least one optical characteristic of the multi-layer stack so as to reduce back reflection from the low-k dielectric layer.

In accordance with a further illustrative embodiment of the present invention, a method of forming a metal region in a low-k dielectric material comprises the deposition of a silicon dioxide based multi-layer in a plasma ambient over a layer including the low-k dielectric material. A recessed portion is formed by photolithography, wherein the multi-layer reduces back reflection. The recessed portion is then filled with a metal. Finally, excess metal and a portion of the multi-layer are removed by chemical mechanical polishing.

BRIEF DESCRIPTION OF THE DRAWINGS

The invention may be understood by reference to the following description taken in conjunction with the accompanying drawings, in which like reference numerals identify like elements, and in which.

Figure 1A:
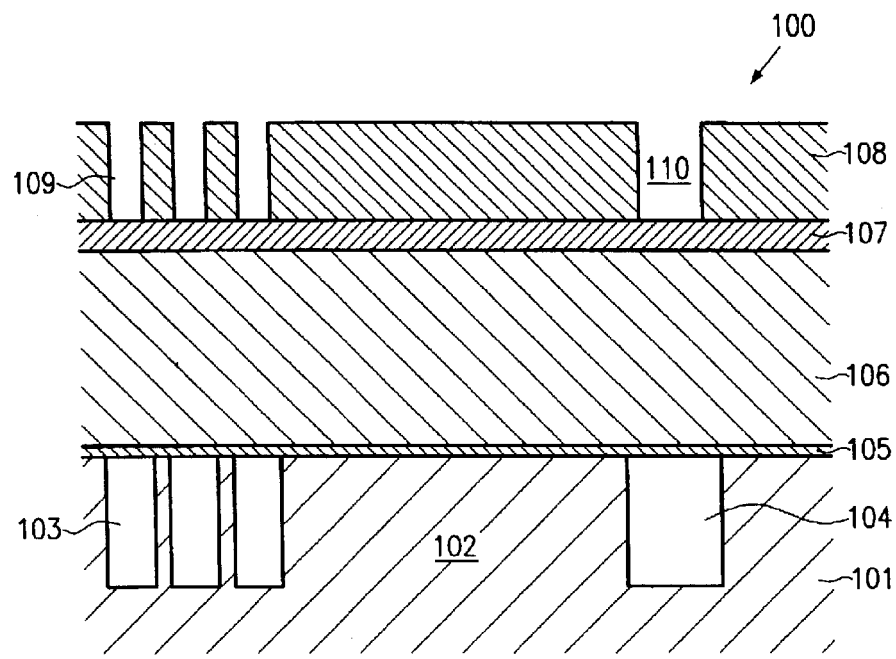
FIGS. 1a-1c schematically show cross-sectional views of a semiconductor structure including a low-k dielectric layer that is patterned in accordance with a conventional process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
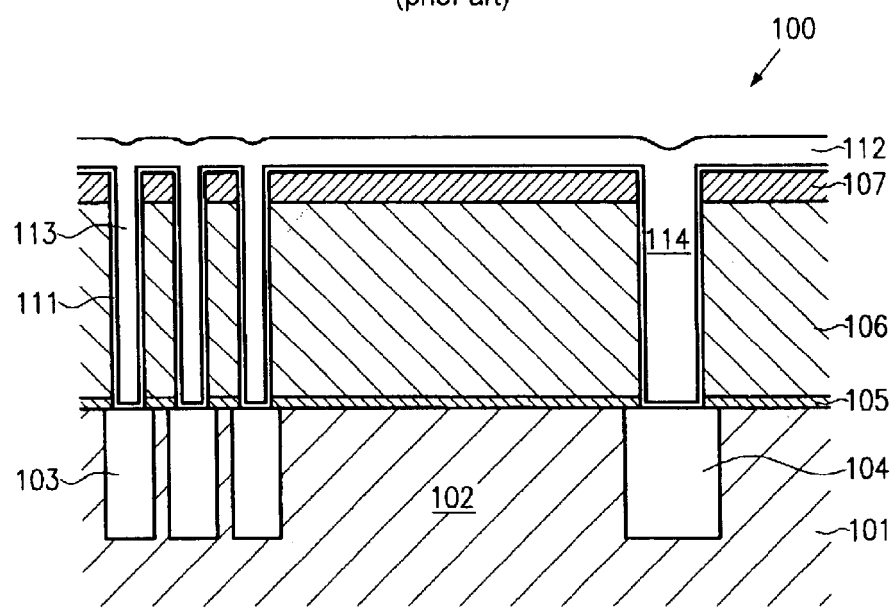
Figure 1C:
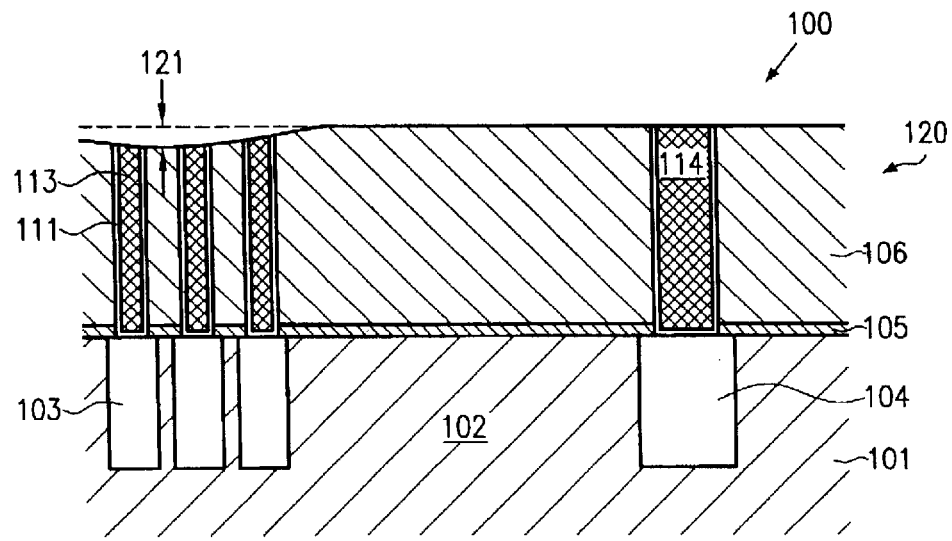
Figure 2A:
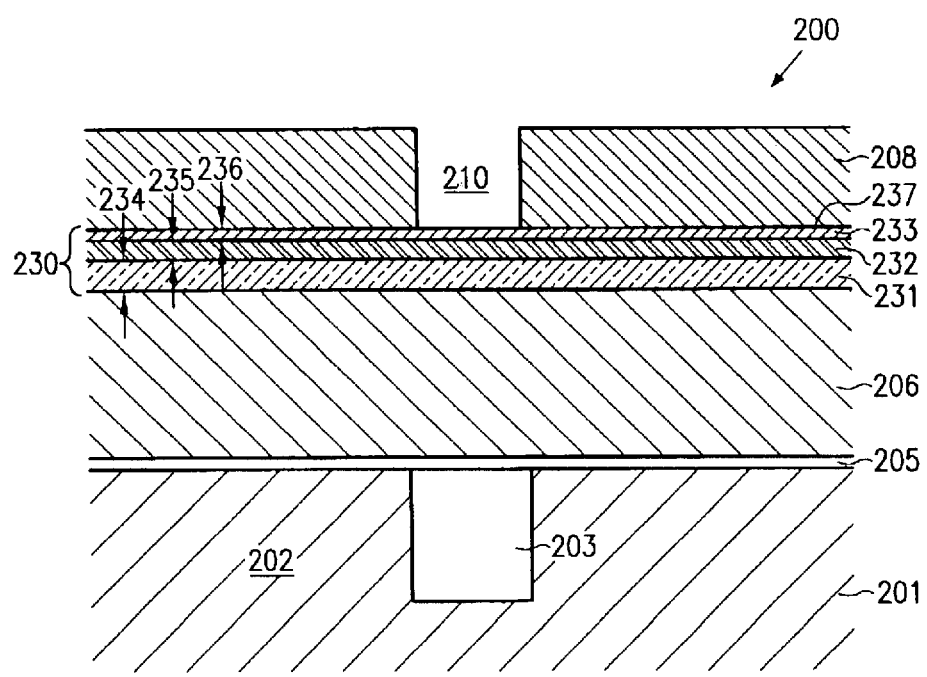
FIGS. 2a-2c schematically show cross-sectional views during patterning of a dielectric layer including a low-k dielectric material in accordance with illustrative embodiments of the present invention.

With reference to FIGS. 2a-2c and FIG. 3, illustrative embodiments of the present invention will now be described. In FIG. 2a, a semiconductor structure 200 comprises a substrate 201 including a dielectric layer 202 comprised of a dielectric material, such as a standard material, for example, silicon dioxide, silicon nitride and the like, or a low-k dielectric material. The dielectric layer 202 may comprise a metal region 203 over which a trench or via is to be formed. As previously noted with reference to FIGS. 1a-1c, the substrate 201 may comprise a plurality of circuit elements, one or more of which may be electrically connected to the metal region 203. An etch stop layer 205 is formed over the dielectric layer 202 and the metal region 203, wherein the etch stop layer 205 may be comprised of any appropriate material having a high etch selectivity with respect to an overlying dielectric layer 206 that is substantially comprised of a low-k dielectric material. Suitable materials for the dielectric layer 206 may include hydrogen-containing silicon oxycarbide (SiCOH), porous SiCOH, SiLK, porous SiLK, HSQ, MSQ, and the like. A multi-layer stack 230 is formed on the dielectric layer 206, wherein, in one embodiment, the multi-layer stack 230 comprises a first layer 231 substantially comprised of silicon dioxide, a second layer 232, substantially comprised of a silicon-rich oxynitride and a protection layer 233 having a significantly reduced amount of nitrogen atoms. The multi-layer stack 230 will also be referred to as a silicon dioxide based layer due to the silicon dioxide present in the multi-layer stack and due to the formation sequence, as will be described below.

The first, second and the protection layers 231, 232 and 233 of the multi-layer stack 230 have respective thicknesses 234, 235 and 236. The optical characteristics of the multi-layer stack 230 are determined by the respective thicknesses and the composition of the individual layers. In particular, the optical characteristics, such as index of refraction and extinction coefficient, of the second layer 232 may be adjusted by correspondingly selecting the amount of silicon and nitrogen contained therein. A photoresist mask 208 is formed on the multi-layer stack 230 with an opening 210 formed therein. The dimensions of the opening 210 substantially correspond to the dimensions of a trench or via to be formed in the low-k dielectric layer 206.

With reference to FIG. 2a as well as to FIG. 3, a process flow for forming the semiconductor structure 200 in accordance with illustrative embodiments will now be described. The dielectric layer 202 and the metal region 203 may be formed in accordance with well-known and well-established process techniques, which depend on the type of metallization layer considered. If, for example, the dielectric layer 202 and the metal region 203 are to represent contact portions to underlying circuit elements, such as transistors, the formation sequence may include process steps such as depositing silicon dioxide and tungsten as a contact metal so as to obtain the layer 202 and the metal region 203. If the dielectric layer 202 is to represent a low-k dielectric layer, the corresponding process steps may include similar processes, as will be described below when referring to the formation and patterning of the dielectric layer 206. Next, the etch stop layer 205 may be deposited, for example, by plasma enhanced chemical vapor deposition (PECVD) from appropriate precursor gases.

Figure 3:
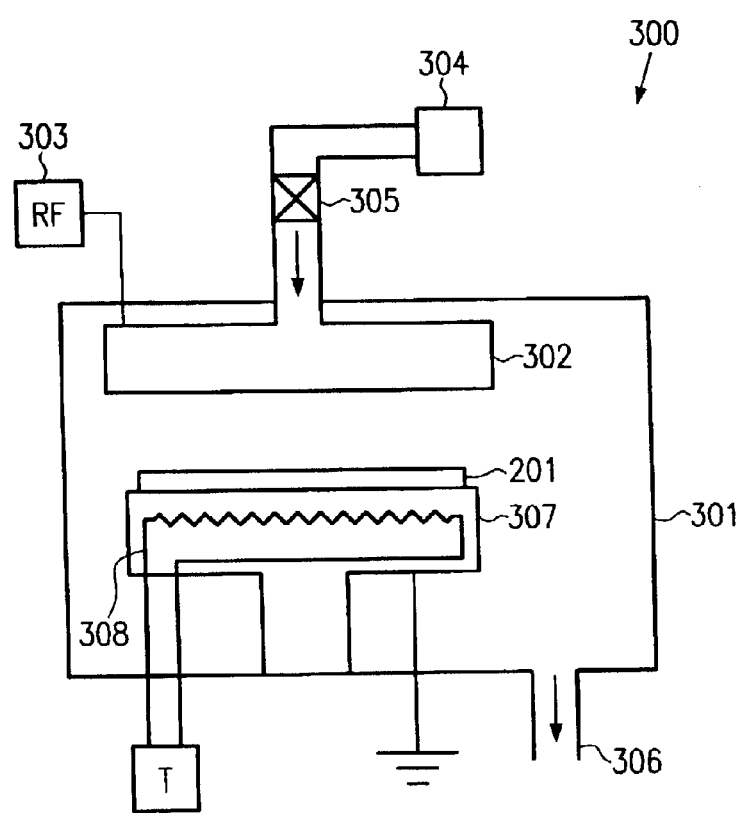
FIG. 3 schematically shows a deposition tool for plasma enhanced chemical vapor deposition (PECVD) that is appropriate for forming a multi-cap layer as described in FIGS. 2a-2c.

FIG. 3 schematically depicts a PECVD tool 300 in a simplified manner. The deposition tool 300 comprises a process chamber 301 including a plasma excitation means 302 that is connected to a power source 303, such as an RF generator. A source of precursor gases 304 is connected via a controllable valve assembly 305 with the process chamber 301. An outlet 306 is connected to suitable means (not shown) configured to remove gases and by-products from the process chamber 301 and to maintain a required pressure within the chamber 301. Furthermore, the deposition tool 300 comprises a substrate holder 307 configured to receive and hold a substrate, such as the substrate 201 shown in FIG. 2a. The substrate holder 307 may comprise a controllable heater 308 for maintaining the temperature of the substrate 201 within a specified range.

After mounting the substrate 201 on the substrate holder 307, a plasma ambient is established within the process chamber 301 by activating the RF generator 303 and feeding appropriate precursor and carrier gases to the chamber 301. If the etch stop layer 205 is substantially comprised of silicon carbide and/or a nitrided silicon carbide layer, respective precursor gases, such as 3MS (trimethylsilane) and ammonia may be supplied.

Next, the low-k dielectric layer 206 is formed, for example by PECVD, from appropriate precursor gases, thereby using a deposition tool as shown in FIG. 3. For example, silicon-based low-k dielectric materials may be deposited from 3 MS in accordance with well-known process recipes. In other embodiments, the dielectric layer 206 may be formed by spin-on techniques to thereby form, for example, a layer of MSQ or HSQ (hydrogen sisquioxane). It should be noted that the present invention is not limited to the type of low-k material and may be used with any type of low-k material, irrespective of the way the layer 206 is manufactured. Subsequently, the substrate 201 may be placed in a deposition tool, such as the tool 300, or may be maintained within the process chamber 301 when the low-k dielectric layer 206 has been deposited by PECVD. In one particular embodiment, the first layer 231, substantially comprised of silicon dioxide, is formed from silane and nitrogen oxide ($N_2O$). During the deposition of the silicon dioxide, the pressure within the chamber 301 may be maintained in the range of approximately 2–4 Torr with a ratio of silane:nitrogen oxide in the range of approximately $1/4s:1/5s$. Thereby, the flow rate of nitrogen oxide may be adjusted to approximately 3500–4500 sccm and the flow rate of silane to approximately 60–100 sccm. The RF power supplied to the plasma excitation means 302 may be maintained within a range of approximately 150–450 Watts, wherein the temperature of the substrate 201 is maintained within a range of approximately 350–450° C. With the above-specified parameter ranges, a deposition rate of approximately 2.5-4 nm/second, which will hereinafter also be referred to as low deposition rate process, may be obtained. Since the deposition rate is known in advance with sufficient accuracy, for example, by performing one or more test runs, the thickness 234 of the layer 231 may be controlled by adjusting the deposition time. In other embodiments, the thickness 234 may be controlled by an in situ measurement carried out with an appropriate measurement tool (not shown), such as an ellipsometer optically coupled to the process chamber 301.

In a further illustrative embodiment, referred to as a high deposition rate process, a higher deposition rate may be obtained by the following process parameters. The silane flow rate is adjusted to approximately 100–400 sccm, the silane nitrogen oxide ($N_2O$) ratio is in the range of approximately $1/10$ to $1/20$, whereas the remaining parameters may be adjusted to the values specified above in the low deposition rate process. With this parameter setting, a deposition rate of approximately 10–30 nm/second is obtained.

Prior to the formation of the second layer 232, a pump step may be carried out so as to remove gas residuals and by-products of the preceding deposition process. Therefore, the pressure is adjusted to a range of approximately 4–8 Torr while supplying nitrogen as a carrier gas with a flow rate of approximately 7000–9000 sccm. Furthermore, the silane/nitrogen oxide ratio is increased to approximately 2–3, wherein a typical flow rate for silane is in the range of 400–600 sccm and that of nitrogen oxide is correspondingly adjusted. With an RF power in the range of approximately 300–600 Watts with the substrate temperature maintained in substantially the same range as in the preceding deposition step, a deposition rate of approximately 8–12 nm/second is achieved. As previously noted, the optical characteristics of the multi-layer stack 230 may be tuned by adjusting the respective thicknesses of the individual layers and especially by varying the silicon and nitrogen contents in the second layer 232. For a silane:nitrogen oxide ($N_2O$) ratio in the above-specified range, the refractive index of the second layer 232 may be adjusted to 2.20–2.60 and the extinction coefficient to approximately 0.80–0.90 for an exposure wavelength of 248 nm. Contrary thereto, the first layer 231, which is substantially comprised of silicon dioxide, exhibits relatively uniform optical characteristics with a refractive index in the range of approximately 1.40–1.47 at 673 nm with only slight variations. Thus, for a required thickness of the first layer 231, which is selected in accordance with requirements of a subsequently performed CMP process, the anti-reflective characteristics of the multi-layer stack 230 may then be suitably adjusted by controlling the optical characteristics and/or the thickness of the second layer 232. In some illustrative embodiments, the thickness 234 of the first layer 231 is adjusted within a range of approximately 20–120 nm, wherein the low deposition rate process may be used for a range of approximately 20–50 nm and the high deposition rate process may be used for the range of approximately 50–120 nm, whereas the thickness 235 of the second layer 232 is adjusted to a range of approximately 30–90 nm.

In one particular embodiment, the protection layer 233 is formed on the second layer 232 with a significantly reduced concentration of nitrogen, especially at a surface 237 thereof, which is in contact with a photoresist layer formed thereon. The reduced nitrogen contents in the protection layer 233, and especially at the surface 237, significantly reduces or even substantially completely avoids any interaction of a photoresist with nitrogen, which may otherwise form photoresist residuals after development of the photoresist.

The protection layer 233 may be formed by a plasma treatment in a nitrogen oxide ($N_2O$) ambient at a pressure of approximately 3.0–5.0 Torr at a temperature of approximately 350–450° C., using an RF power of approximately 50–200 Watts, wherein a flow rate of the nitrogen oxide ($N_2O$) is set to approximately 250–600 sccm. With the above-specified parameter setting, a thickness 236 of the protection layer 233 within a range of approximately 1–4 nm is obtained, wherein, especially at the surface 237, a majority of the silicon nitrogen bondings is replaced by a silicon oxygen bonding. The formation of the protection layer 233 may be carried out immediately after the deposition of the second layer 232.

Next, a layer of photoresist is deposited on the multi-layer stack 230, wherein a layer thickness of the photoresist, as well as the type and composition thereof, is selected in conformity with the photolithography requirements. As previously noted, the optical characteristics, such as the index of refraction and the extinction coefficient, as well as the individual thicknesses 234, 235 and 236 of the multi-layer stack, are adapted to the photoresist used so as to obtain a minimum variation of critical dimensions. Thereafter, the photo-resist layer is exposed and developed to form the opening 210, wherein, during exposure, a back reflection of light into regions of the photoresist adjacent to the opening 210 is minimized. In this way, resist residuals within the opening 210, also referred to as footing and scumming, may be reduced or even completely avoided.

Figure 2B:
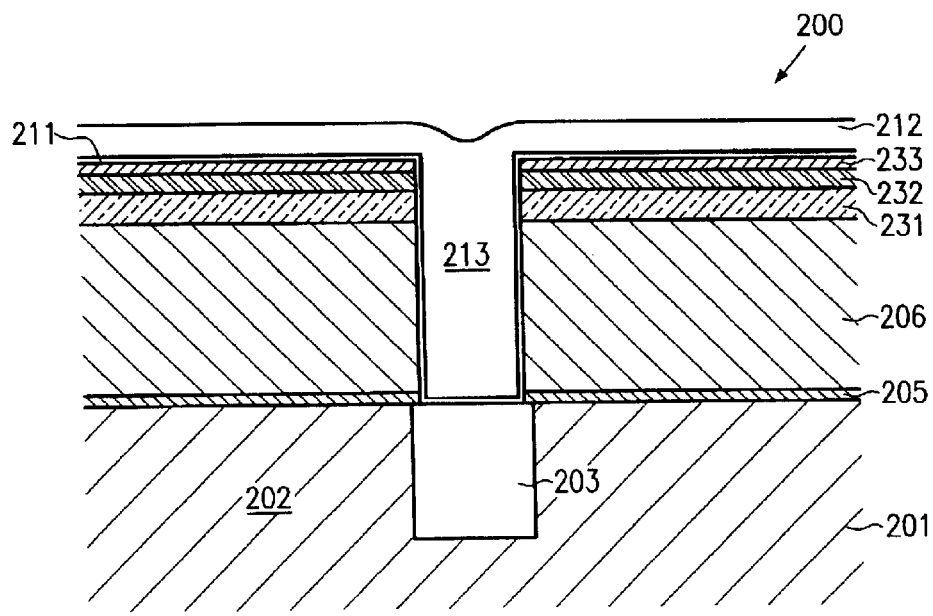

FIG. 2b schematically shows the semiconductor structure 200 with an opening 213 formed in the multi-layer stack 230, the low-k dielectric layer 206 and the etch stop layer 205. A barrier layer 211 is formed over the multi-layer stack 230 and within the opening 213, and a metal layer 212, for example comprised of copper, is formed over the structure 200 so as to substantially completely fill the opening 213.

The opening 213 may be formed by a sequence of anisotropic etch processes, similarly as described with reference to FIG. 1b, and the barrier layer 211, which may be comprised of two or more sub-layers, for example including a tantalum/tantalum nitride layer, is then deposited by sputter deposition. Thereafter, a thin seed layer (not shown) is sputter deposited and then the bulk metal is deposited by a well-known electrochemical deposition method.

Thereafter, the excess metal of the layer 212 is removed by chemical mechanical polishing, wherein additionally the barrier layer 211 outside the opening 213 is also removed. During the CMP process, the multi-layer stack 230 may also be partially removed, wherein the first layer 231, substantially comprised of silicon dioxide, reliably protects the underlying low-k dielectric material of reduced mechanical stability. In one illustrative embodiment, the protection layer 233 and the second layer 232 are substantially completely removed. Consequently, the overall dielectric constant of the finally obtained intra-layer dielectric is substantially determined by the low-k dielectric layer 206 as the second layer 232, having a high amount of nitrogen incorporated into it and thus having a relatively high dielectric constant, is removed. Moreover, a portion of the first layer 231 may also be removed so as to further minimize the overall dielectric constant. Since the first layer 231 exhibits a relatively low removal rate during the copper CMP process, the underlying low-k dielectric material of the layer 206 is reliably protected, even if slight process variations during the CMP process occur. Consequently, undesired removal of the low-k dielectric material is substantially avoided, and therefore the variations in dimensions of the metal-filled openings 213, and thus the variations in resistivity thereof, are also significantly reduced.

Figure 2C:
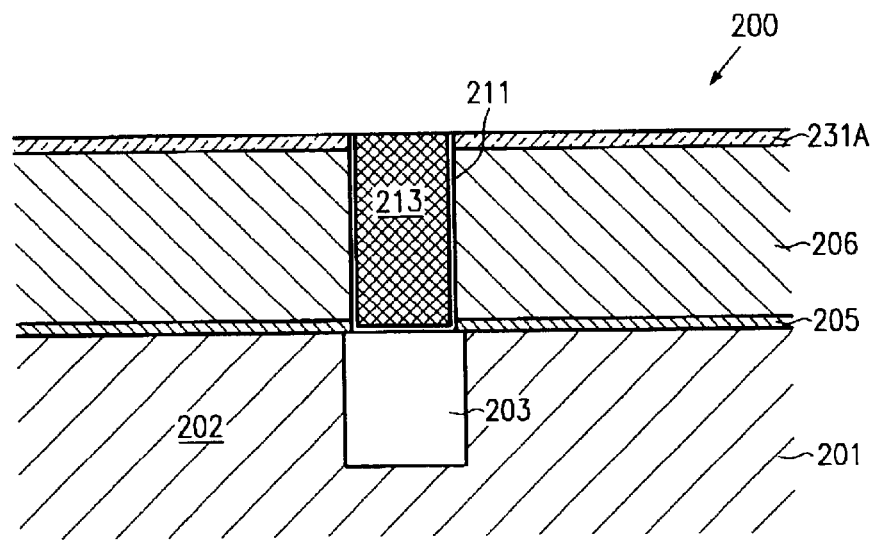

FIG. 2c schematically shows the semiconductor structure 200 after completion of the above-described CMP process. A silicon dioxide layer of reduced thickness, indicated by 231a, is still formed over the low-k dielectric layer 206 so that CMP-induced damage of the layer 206 is minimized. In one embodiment, the thickness of the layer 231a may be reduced to 20 nm and less so as to obtain a required low total dielectric constant of the intra-layer dielectric.

It should be noted that in the above embodiments, a single damascene process technique is described, wherein the present invention is also applicable to any process scheme of the damascene technique, such as dual damascene methods and the like.

As a result, according to the present invention, a multi-layer stack for patterning a low-k dielectric is provided, wherein the multi-layer stack may preferably be formed in situ by a relatively inexpensive plasma enhanced deposition method allowing a high rate of throughput, for example 80 substrates per hour or more may be processed, wherein the low-k dielectric material is effectively protected during the CMP process for removing excess metal, and, at the same time, an efficient anti-reflective effect is obtained, allowing the patterning of the low-k dielectric material substantially without creating "footing and scumming" effects. Due to the effective protection of the low-k dielectric layer during the CMP process, damage of the material, especially in regions including densely spaced structures, may be significantly reduced. Therefore, fluctuations in the sheet resistance of the corresponding metal structures are also remarkably reduced. By thinning the multi-layer stack during the CMP process, the effective value of the dielectric constant may nevertheless be kept extremely low so that deleterious effects on the parasitic RC time constants may be substantially avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming a multi-layer stack over a dielectric layer comprised of a low-k dielectric material by forming a layer of silicon dioxide over said low-k dielectric layer;

forming a silicon-rich oxynitride layer during the formation of said layer of silicon dioxide to thereby adjust at least one optical characteristic o said multi-layer stack so as to reduce back reflection from said low-k dielectric layer;

forming a resist mask over said silicon-rich oxynitride layer, patterning said dielectric layer with resist maks to form a recess in said dielectric layer;

filling said recess with a metal;

removing excess metal and said silicon-rich oxynitride layer by chemical mechanical polishing; and reducing a thicknes of said silicon dioxide based layer during chemical mechanical
   polishing to a thickness of approximately 5—20 nm.

2. A method of forming a metal region in a low-k dielectric material, the method comprising:

depositing a silicon dioxide based multi-layer in a plasma ambient over a layer including said low-k dielectric material while controlling optical characteristics of said silicon dioxide based multi-layer, wherein said multi-layer comprises a silicon dioxide layer formed on said dielectric layer with a thickness in the range of approximately 20—120 nm;

forming a recessed portion by photolithography, wherein said multi-layer reduces back reflection for a specified wavelength;

filling said recessed portion with a metal; and removing excess metal and a portion of said multi-layer by chemical mechanical polishing.

3. The method of claim 2, wherein said silicon-rich oxynitride layer is formed by varying a deposition atmosphere after the formation of said silicon dioxide based multi-layer.

4. The method of claim 2, wherein said optical characteristics are adjusted by varying the silicon amount in said silicon-rich oxynitride layer.

5. The method of claim 4, wherein said silicon amount is varied by adjusting a silane/nitrogen oxide ($N_2O$) ratio in a deposition atmosphere.

6. A method of forming a metal region in low-k dielectric material, the method comprising:

depositing a silicon dioxide based multi-layer in a plasma ambient over a layer including said low-k dielectric material while controlling optical characteristics of said silicon dioxide based multi-layer, wherein a silicon-rich oxynitride layer having a thickness in the range of approximately 30—90 nm is formed in the multi-layer by varying a deposition atmosphere during the formation of said silicon dioxide based multi-layer;

forming a recessed portion by photolithography, wherein said multi-layer reduces back reflection for a specified wavelength;

filling said recessed portion with a metal; and removing excess metal and a portion of said multi-layer by chemical mechanical polishing.

7. The method of claim 6, wherein said optical characteristics are adjusted by varying the silicon amount in said silicon-rich oxynitride layer.

8. The method of claim 7, wherein said silicon amount is varied by adjusting a silane/nitrogen oxide ($N_2O$) ration in a deposition atmosphere.

9. A method of forming a metal region in a low-k dielectric material, the method comprising:

depositing a silicon dioxide based multi-layer in a plasma ambient over a layer including said low-k dielectric material while controlling optical characteristics of said silicon dioxide based multi-layer, wherein a silicon-rich oxynitride layer is formed in the multi-layer;

forming a nitrogen-depleted protection layer in a surface region of said silicon dioxide based multi-layer, wherein said protection layer is formed by exposure to a nitrogen oxide ($N_2O$) plasma ambient;

forming a recessed portion by photolithography, wherein said multi-layer reduces back reflection for a specified wavelength;

filling said recessed portion with metal; and removing excess metal and at least said protection layer and said silicon-rich oxynitride layer by a chemical mechanical polishing process, wherein a thickness of said silicon dioxide based multi-layer is reduced during said chemical mechanical polishing process to a thickness of approximately 5—20 nm.

10. The method of claim 9, wherein a thickness of said protection layer is in the range of approximately 1—5 nm.

11. The method of claim 9, wherein said silicon dioxide based multi-layer of reduced thickness is comprised of silicon dioxide.

* * * * *

UNITED STATES PATENT AND TRADEMARK OFFICE
CERTIFICATE OF CORRECTION

| | |
|---|---|
| PATENT NO. | : 7,030,044 B2 |
| APPLICATION NO. | : 10/463910 |
| DATED | : April 18, 2006 |
| INVENTOR(S) | : Hartmut Ruelke et al. |

It is certified that error appears in the above-identified patent and that said Letters Patent is hereby corrected as shown below:

Col. 10, line 54 (claim 1, line 7), change "o said" to -- of said --.

Col. 10, line 58 (claim 1, line 11), change "layer," to -- layer; --.

Col. 10, line 59 (claim 1, line 12), before "resist" insert -- said --.

Col. 10, line 59 (claim 1, line 12), change "maks" to -- mask --.

Col. 10, line 64 (claim 1, line 17), change "thicknes" to -- thickness --.

Col. 11, line 12 (claim 2, line 12), change "wavelength:" to -- wavelength; --.

Col. 11, line 16 (claim 3, line 1), change "said" to -- a --.

Col. 11, line 17 (claim 3, line 2), after "formed" insert -- in the multi-layer --.

Col. 11, line 18 (claim 3, line 2), change "after" to -- during --.

Col. 11, line 26 (claim 6, line 1), after "region in" insert -- a --.

Col. 12, line 8 (claim 8, line 2), change "ration" to -- ratio --.

Col. 12, line 26 (claim 9, line 15), after "portion with" insert -- a --.

Signed and Sealed this

Eighteenth Day of July, 2006

JON W. DUDAS
*Director of the United States Patent and Trademark Office*